April 19, 1966 T. W. GRISWOLD 3,247,032

METHOD FOR CONTROLLING DIFFUSION OF AN ACTIVE IMPURITY MATERIAL INTO A SEMICONDUCTOR BODY

Filed June 20, 1962 2 Sheets-Sheet 1

THOMAS W. GRISWOLD
INVENTOR.

BY Nilsson & Robbins
ATTORNEYS

April 19, 1966 T. W. GRISWOLD 3,247,032
METHOD FOR CONTROLLING DIFFUSION OF AN ACTIVE IMPURITY
MATERIAL INTO A SEMICONDUCTOR BODY
Filed June 20, 1962 2 Sheets-Sheet 2

THOMAS. W. GRISWOLD
INVENTOR.

BY
Nilsson & Robbins
ATTORNEYS.

United States Patent Office 3,247,032
Patented Apr. 19, 1966

3,247,032

METHOD FOR CONTROLLING DIFFUSION OF AN ACTIVE IMPURITY MATERIAL INTO A SEMICONDUCTOR BODY

Thomas W. Griswold, Pacific Palisades, Calif., assignor to Continental Device Corporation, Hawthorne, Calif., a corporation of Delaware Filed June 20, 1962, Ser. No. 203,947
15 Claims. (Cl. 148—188)

This invention relates generally to the manufacture of semiconductor devices and more particularly to a method of diffusing an active impurity material into a semiconductor body from a controlled and contained source thereof in direct contact with the semiconductor body.

Changing the electrical conductivity type of a portion of a semiconductor body to thereby form a semiconductor diode or a transistor through the technique of diffusing atoms of an active impurity material into selected portions of the semiconductor body is at the present state of the art a well known technique. As the present state of the art the atoms of active impurity material which are to be diffused into selected portions of the semiconductor body are normally obtained from one of two sources. In accordance with one well known technique, atoms of active impurity material are entrained in a carrier gas and are passed over bodies of semiconductor material contained within a diffusion furnace which is maintained at a predetermined temperature for a period of time sufficient to deposit atoms of the active impurity material upon the surface of the semiconductor body and to begin diffusion of the impurity atoms into the body. In accordance with the other presently accepted technique of diffusion, all parts of the interior of the diffusion furnace including fittings and the like are fully saturated with atoms of the active impurity material. Thereafter the body of semiconductor material is placed into the furnace which is maintained at a predetermined temperature for a predetermined time so that the atoms of active impurity material are deposited thereupon from the interior surfaces of the furnace now acting as the source for the active impurity atoms.

When either of these two methods of diffusion are utilized, certain inherent limitations and difficulties are encountered. In either case the particular diffusion furnace that is utilized for applying the active impurity atoms to the surface of the semiconductor body is limited in use to that specific purpose only. Such limited use necessitates the increase in expenditure of funds for diffusion furnaces, thus increasing the cost of manufacture of devices. It has also been found that the lifetime of a diffusion furnace utilizing either of these two types of diffusion techniques for depositing active impurity material upon the semiconductor body is quite short compared to the life of the same kind of furnace when little or no active impurity atoms are passed therethrough. For example, the lifetime of a diffusion furnace used in the above techniques with the best of care is at most approximately two months. On the other hand a diffusion furnace used where substantially no active impurity atoms are passed therethrough is with reasonable care at least one year.

Another inherent problem utilizing either of the two methods of depositing active impurity material upon the semiconductor body as above outlined is that the amount of active impurity material which is deposited upon the surface of the semiconductor body is exceedingly difficult to control. This control difficulty arises from the fact that the material from which the furnace and the fittings is constructed has a great tendency to absorb a portion of the active impurity atoms that are passing through the diffusion furnace. With some active impurity materials for example, boron, this problem becomes exceedingly acute.

Thus, when the active impurity material is entrained in a carrier gas it is difficult to ascertain the amount of the active impurity material that is being deposited upon the semiconductor body as opposed to the amount that is being absorbed by the furnace. On the other hand, when the diffusion furnace and its fittings is being utilized as the source for the active impurity material, it becomes exceedingly difficult to ascertain and control the amount of active impurity material that is absorbed into and subsequently driven from the interior furnace surfaces for deposition upon the surface of the semiconductor body. Since in either case it is difficult to control the amount of active impurity material actually deposited, it becomes also difficult to control the diffusion of the impurity material into the semiconductor body.

In an attempt to combat some of the above prior art disadvantages, a third technique of diffusion was developed. In this technique, an enclosed box is utilized. Both the doping material and the semiconductor bodies are placed within the box and the entire assembly is then placed within the furnace. While this technique does eliminate some of the problems above referred, it introduces some additional limitations. The boxes used are quite fragile and require delicate handling thus adding inconvenience to the process and the boxes have a very limited capacity for semiconductor material.

In carrying out either of the processes for diffusion as above outlined, it has been found necessary to utilize extremely pure grades of source material for the active impurity atoms that are transmitted to the diffusion furnace for deposition upon the semiconductor bodies. Obviously, the requirement for such extremely pure grades of material adds to the cost of manufacture of the semiconductor devices.

Utilizing prior art techniques of diffusion of active impurity materials into semiconductor bodies and particularly the first two above referred to, it has also been found that atoms of the active impurity material have a tendency to leave the surface of the semiconductor body upon which they have been deposited and enter the oxide layer being formed during the diffusion. The greatest disadvantage which this problem presents is that the active impurity material deposited upon the surface of the semiconductor body is depleted. The rate of depletion is varied by ambient furnace conditions and rate of growth of the oxide layer. Since the deposited material is the source of impurity atoms for diffusion, control of the amount of active impurity material directly available for diffusion into the semiconductor body becomes difficult.

Accordingly it is an object of the present invention to provide a method of diffusing an active impurity material into a semiconductor body from an accurately controlled source thereof which method decreases costs of manufacture of semiconductor devices, is simple, and eliminates the perior art disadvantages above referred to.

It is another object of the present invention to provide a method for accurately controlling the quantity of active impurity material deposited upon the surface of a semiconductor body and for containing said active impurity material in direct contact with said body during diffusion thereof into the semiconductor material.

It is another object of the present invention to provide a method for depositing active impurity material upon a semiconductor body for subsequent diffusion thereof which eliminates the necessity of utilizing high purity grades of active impurity source material.

Other objects and advantages of the method of the present invention will become apparent from a consideration of the following description taken in conjunction with the accompanying drawing which is presented by way of example only and is not intended as a limitation upon the scope of the present invention as defined in the appended claims and in which:

Figure 1:
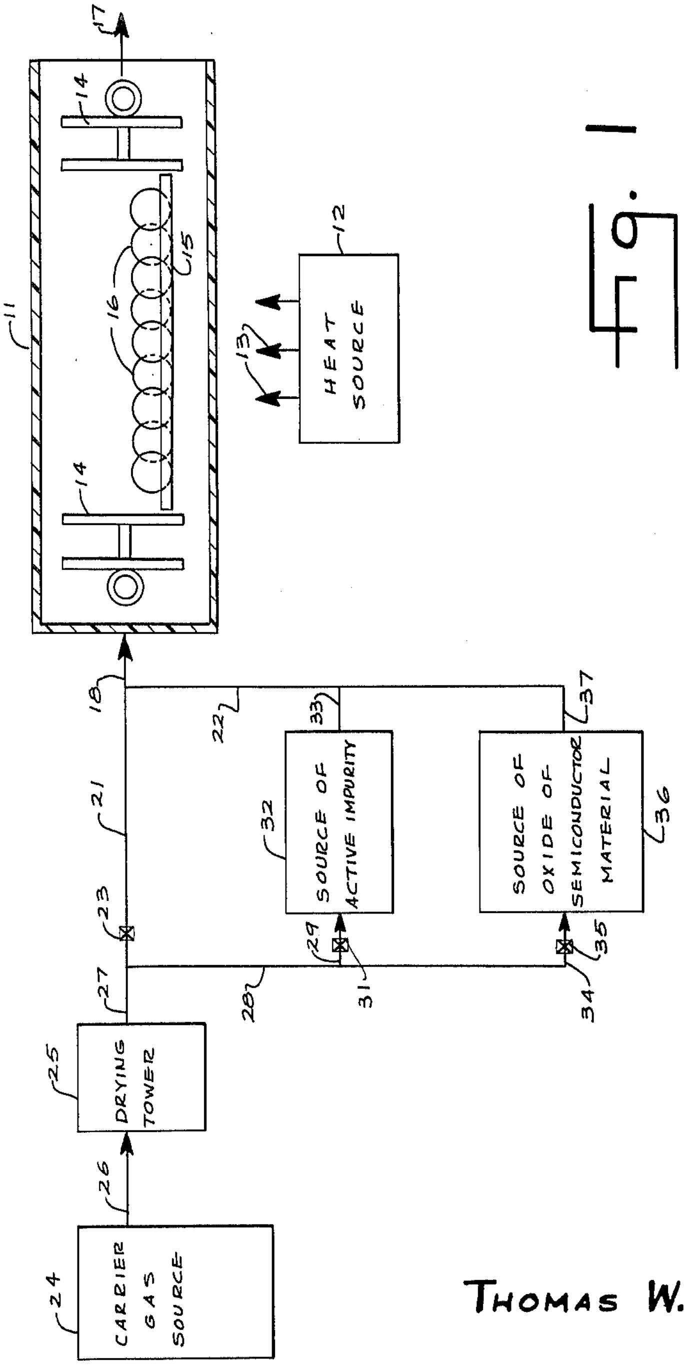
FIG. 1 is a schematic diagram of an apparatus which is suitable for carrying out the method of the present invention.

In accordance with one aspect of the present invention a layer of atoms of active impurity material is deposited upon at least a portion of the surface of a semiconductor body from a decomposable source of such active impurity material. This deposition occurs at relatively low temperatures at which no diffusion of the active impurity material into the semiconductor body can occur. Thereafter, a layer of an oxide of a semiconductor material is deposited upon at least that portion of the semiconductor body upon which the active impurity material has been deposited. The layer of oxide of semiconductor material is provided from a decomposable source thereof which is decomposed at a relatively low temperature such that no diffusion of the previously deposited active impurity atoms occurs during the deposition thereof. Subsequently the semiconductor material having the layers of active impurity material and oxide of semiconductor material thereover is subjected to substantially high temperatures to effect diffusion of the active impurity material into the semiconductor body.

In accordance with a more specific aspect of the present invention, utilizing presently well-known masking techniques, the semiconductor body is first prepared for diffusion by providing a layer of semiconductor oxide, for example by exposure to water vapor and/or oxygen at high temperature (800–1300° C.) over the entire surface of the semiconductor body, Thereafter a portion of the oxide is removed to expose a portion of the surface of the semiconductor body. The above referred to steps of the method of the present invention are then carried out to deposit the active impurity material covered by a layer of oxide of semiconductor material upon the entire surface of the semiconductor body including the layer of semiconductor or oxide previously formed. The semiconductor oxide previously formed prevents the diffusion of the active impurity material into those portions of the semiconductor body covered thereby. The previously deposited active impurity material is caused to diffuse directly into the body at that point previously exposed by removal of the semiconductor oxide coating thereby imparting the desired electrical conductivity type thereto.

Alternatively, in accordance with a specific aspect of the present invention, the active impurity material may be deposited directly upon the entire surface of a body of semiconductor material all of which is exposed. Thereafter a layer of oxide of semiconductor material is applied over the entire area of the previously deposited active impurity material. Subsequently thereto a portion of the oxide of semiconductor material has applied thereto an etch resisting mask after which the semiconductor body is subjected to a standard etching solution. All of the oxide of semiconductor material and active impurity material deposited upon the semiconductor body with the exception of that portion directly under the mask is then etched away. Subsequently to the etching step the semiconductor body is then subjected to a substantially high temperature to diffuse the active impurity material into the semiconductor body, thereby converting the desired portions thereof to the desired electrical conductivity type.

Referring now to the drawings and more particularly to FIG. 1 thereof there is schematically illustrated one apparatus for carrying out the steps of the method of the present invention.

As is shown in FIG. 1 the apparatus includes a furnace 11 having a heat source 12 which operates in conjunction therewith to raise the temperature of the interior of the furnace by application of heat as is illustrated by the arrows 13. The furnace 11 is constructed in accordance with the normally accepted techniques in the semiconductor diffusion furnace art; however in utilizing the method of the present invention the temperatures are relatively low so that the furnace may be constructed of Pyrex or Vycor as opposed to quartz. A pair of baffles 14 are inserted into the furnace 11 in accordance with normally accepted techniques to establish within the furnace a relatively uniform concentration of the gaseous mixture which will be described hereinafter. Also inserted into the furnace 11 is a carrier 15 having thereon a plurality of semiconductor bodies 16 which are to be treated in accordance with the method of the present invention. The furnace as illustrated in FIG. 1, is adapted for a flow therethrough of a gaseous mixture from left to right as viewed in FIG. 1 and as indicated by the arrow 17.

The gaseous mixture is introduced into the furnace 11 through a conduit 18 therefor. The conduit 18 has connected thereto a pair of additional conduits 21 and 22. Interconnected into the conduit 21 is a valve 23 which controls the flow of a carrier gas from a source 24 thereof. The carrier gas also flows through a drying tower 25 by way of a conduit 26. Although the moisture content of the carrier gas is not considered to be critical in accordance with the method of the present invention, the drying tower is utilized merely as a safety measure and may be a typical well known Drierite column which contains calcium-sulphate. From the drying tower there is connected a conduit 27 to transmit the carrier gas into the remainder of the apparatus. If the valve 23 is open the carrier gas passes directly from conduit 27 through conduits 21 and 18 and into the furnace 11. An alternative flow path for carrier gas is provided by conduit 28 which is interconnected to conduit 27. Conduit 28 branches into a pair of conduits 29 and 34. Connected to conduit 29 through a valve 31 is a source of active impurity material 32. The output from the source of active impurity material 32 is connected by way of conduit 33 to the conduit 22. Under those situations where valve 31 is open, the carrier gas flows from the conduit 27 through the conduits 28, 29 and into the source of active impurity material 32. The carrier gas leaves the source of active impurity material 32, passes through conduit 33, 22 and 18 and into the furnace 11. Also interconnected to conduit 28 is an additional flow path through conduit 34 and a valve 35 which then enters a source of oxide of semiconductor material 36. Out of the source 36 the carrier gas passes through a conduit 37 which interconnects with conduit 22 and likewise can empty through conduit 18 into the furnace 11.

For purposes of description of the method of the present invention the carrier gas which is utilized in the inert gas argon. It should, however, be expressly understood that other carrier gases may be utilized if desired. For example oxygen has been found to be highly effective as a carrier gas in carrying out the method of the present invention.

As a source of active impurity material for purposes of describing a specific example of the method of the present invention the ethyl ester of boric acid will be utilized. The ethyl ester of boric acid is also known as triethylborate and that term will be used hereinafter. This source of active impurity material can be utilized when it is desired to impart P-type conductivity characteristics to the semconductor body. When it is desired to impart N-type conductivity characteristics to the semiconductor body, the ester of phosphorous acid has been found to be effective.

Although the esters of the acids of the various well known active impurities have been found to be effective in carrying out the method of the present invention it should be understood that other organic compounds of the active impurity materials may also be utilized. The conditions which must be met in choosing the particular organic compound of the active impurity material in accordance with the method of the present invention is that the compound must be capable of being vaporized for transmission to and through the furnace to contact the semiconductor bodies disposed therein. The transmission into the furnace can be accomplished by the use of a carrier gas or by maintaining the furnace at a vacuum and injecting the material therein. The particular organic compound must also have such characteristics that when subjected to a predetermined temperature, as more fully explained hereinafter, the organic bond between the organic radical and the active impurity material is thermally decomposed thereby depositing the active impurity material upon the surface of the semiconductor wafer.

The source of oxide of semiconductor material which is utilized in accordance with the method of the present invention may be any source which includes semiconductor and atoms and oxygen atoms which can be applied directly to the surface of the semiconductor product after the active impurity material has been deposited as will be more fully explained hereinafter. For purposes of specific example, in describing the method of the present invention, where silicon semiconductor bodies are being treated, the organic compound of teteraethylsilicate will be utilized. It should however be understood that any organic structure which has chemical bonds of the type S—O—R where S is a semiconductor material and R is an organic radical such as methyl, ethyl, butyl, phenyl, and the like, can be utilized. When utilizing such organic structures at the temperatures defined more specifically hereinafter it has been found that the organic bond between the oxygen and the organic radical breaks down thus permitting the silicon and the oxyen atoms to be deposited upon the semiconductor body, that is an oxide of semiconductor material is directly deposited.

It should be understood that the method of the present invention is equally applicable to utilization with all types of semiconductor material, such as for example, silicon, germanium, silicon-germanium alloys, group III–V intermetallic compounds, such as gallium-arsenide, aluminum-antimonide, indium-antimonide, and the like. However, for purposes of ease and clarity of description the present invention will be described with specific reference to silicon as the semiconductor material.

Figure 2:
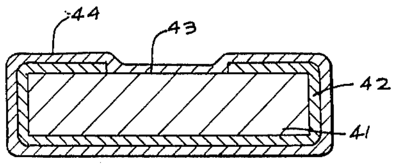
FIGS. 2 through 4 illustrate a semiconductor body at various stages of manufacture in accordance with the method of the present invention.

Two specific examples of forming a semiconductor product in accordance with the method of the present invention will now be described. The first example will be given by reference to FIGS. 2 through 4. Prior to carrying out the steps of the method of the present invention, a silicon semiconductor body 41 is first prepared as is illustrated in FIG. 2. Formed through the process of thermal oxidation in a furnace at a high temperature with water vapor and/or oxygen as the ambient upon the surface thereof is a silicon dioxide layer. The silicon body is then masked in accordance with well known techniques for example utilizing a masking material such as Kodak KPR photoresist material. The silicon dioxide layer is then etched to remove a portion thereof thereby to expose a portion of the surface 43 of the semiconductor body 41. The remainder of the silicon dioxide layer 42 remains unaffected. At this point a plurality of semiconductor bodies thus prepared are loaded into a carrier 15 and placed within the furnace 11 as is illustrated in FIG. 1. Heat is then applied to the furnace 11 from source 12 and the temperature of the furnace is raised to approximately 350° C. Valve 23 is opened and valves 31 and 35 are closed. In this condition argon from the carrier gas source 24 is permitted to flow through the drying tower 25 and into the furnace 11. The argon is permitted to flow through the furnace 11 for a period of approximately 15 minutes to stabilize the temperature and to flush the furnace thereby driving out any contaminants, such as moisture and oxygen, that may residually be in the furnace.

At this point valve 31 is opened while valve 23 remains open, thus causing some of the argon to flow from the carrier gas source 24 through the drying tower, the conduit 27, the conduit 28, through the conduit 29 and into the source of active impurity material 32 which in this case is triethyl-borate. The triethyl borate dispersed in the argon carrier gas leaves the source 32, travels through the conduits 33 and 22 and joins the source of argon at the juncture of conduits 21 and 22 and flows through conduit 18 into the furnace 11. As the dilute mixture of triethyl-borate and argon flows through the furnace which is now maintained at a temperature level of 350° C., the organic bond between the ethyl radical and the boron compound is broken. The boron compound is thereby caused to deposit upon the surface of the semiconductor bodies 16 while the remaining part of the gas is carried out of the furnace 11 and is exhausted. In this manner a boron material layer 44 (FIG. 2) is provided upon the surface of the semiconductor body 41. The layer 44 completely surrounds the body 41 and oxide layer 42. It should particularly be noted that the boron material layer 44 directly contacts the exposed surface 43 of the body 41.

The flow of the triethyl-borate through the furnace is permitted to continue for approximately a two-minute period of time. Valve 31 is then closed thus removing the active impurity material source from the furnace 11. Thereafter valve 23 is closed and valve 34 is opened causing the argon gas to pass directly through the source of oxide of semiconductor material 36 which in this case is tetraethyl silicate. The passage of the argon through the tetraethyl silicate source 36 causes the mixture of tetraethyl silicate and argon to pass through conduits 37, 22, and 18, and into the furnace 11. At the same time the temperature of the heat source is raised to approximately 600° C. There is, however, no stabilization period. The flow of the tetraethyl silicate-argon mixture is permitted to continue for a period of approximately one hour.

Figure 3:
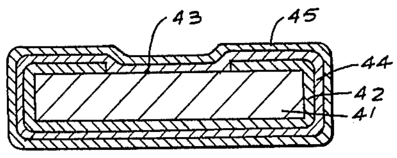

As the argon-tetraethyl silicate mixture passes through the furnace 11, at the temperature of approximately 600° C., the bond between the oxygen atoms and the ethyl radical is thermally decomposed. This decomposition of the bond causes the silicon and the oxygen atoms to be deposited directly upon the surface of the semiconductor body, thus forming a layer 45 as illustrated in FIG. 3 which completely covers the layer of boron material 44 that was deposited in the previous step. It should be noted particularly that at this point a layer of active impurity doping material of a precisely known quantity is sandwiched between the exposed surface 43 of the body 41 and the oxide of semiconductor material layer 45. The doping material is thereby contained in direct contact with the surface of the body 41 and during subsequent treatment can diffuse into the body 41. The doping material will diffuse into the layer of oxide of semiconductor material. However since this layer is formed and seals the active impurity material in place, the amount of diffusion into the oxide of semiconductor material is known and compensated for during deposition of the active impurity material. After the layer of silicon and oxygen atoms have been deposited thus forming a layer of an oxide of silicon upon the surface of the silicon semiconductor body, the valve 35 is closed, the heat source is turned off, and the carrier 15 containing the semiconductor bodies 16 is removed from the furnace 11.

The exact nature of the oxide of silicon layer thus formed by directly depositing atoms of silicon along with atoms of oxygen upon the surface of the semiconductor bodies as illustrated in FIG. 3 is not precisely understood at the present time. It has however been discovered that the particular oxide of silicon thusly formed is not as tenacious or tough as the silicon dioxide layer which is formed by the normal thermal oxidation process above mentioned. It has been found, for example, that when a thermally formed silicon dioxide layer of a given thickness is subjected to an etching solution of ammonium fluoride, it requires several minutes to remove it. When an oxide of silicon layer of exactly the same thickness formed in accordance with the present invention is subjected to such an etch it requires only a few seconds to remove it.

It should be noted that the temperatures utilized during the method steps of the present process are quite low, namely, 350° C. for the deposition of the impurity material and 600° C. for the deposition of the oxide of semiconductor material. The times for which the semiconductor body is subjected to these temperatures is relatively short. It can therefore be seen that no diffusion of the active impurity material into the semiconductor body occurs. Therefore, the entire body as shown in FIG. 3 may be subjected to an ammonium fluoride etch for a very few seconds and all of the deposition that has taken place in carrying out the method of the present invention is removed and the semiconductor body can be subjected to further treatment as such is desired. This being the case, it should become readily apparent to those skilled in the art that materials' waste at this step of production can be substantially eliminated thus resulting in an increased savings and ulimate reduction in cost of semiconductor devices.

Figure 4:
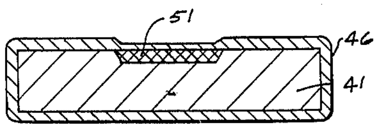

Subsequent to the carrying out of the steps of the method of the present invention as above set forth the semiconductor body is subjected to elevated temperatures in the range normally required for diffusion of boron into a silicon semiconductor body. At the same time the semiconductor body may be subjected to an atmosphere which will cause a silicon dioxide coating to form upon the surface of the semiconductor body in the normally accepted manner. During the diffusion process the previously deposited boron is caused to diffuse into the semiconductor body at the exposed surface 43 thereof. The resulting device would be as illustrated in FIG. 4 wherein the semiconductor body 41 has a diffused region 51 of a P-type conductivity since boron was utilized as the active impurity material. About the entire surface is a layer 46 of thermally formed silicon dioxide which covers all of the material previously deposited in carrying out the method of the present invention.

During this diffusion step all of the boron active impurity material which was deposited upon the exposed surface 43 of the semiconductor body 41 is utilized as a source of active impurity material; that is, the layer 45 of oxide of silicon contains the deposited boron material in contact with the exposed surface of the semiconductor material and prevents it from escaping into the atmosphere within the diffusion furnace. By so containing the boron or other active impurity material, it should become readily apparent that by accurately controlling the amount of active impurity material that is permitted to flow into the furnace 11 a precise amount of active impurity material can be applied to the semiconductor body and thereby the resistivity and depth of penetration of the diffusion can be accurately controlled during the diffusion process.

Although temperatures of 350° C. and 600° C. have been specified above, it should be readily understood that these temperatures are given as nominal and by way of example only. When utilizing argon as the carrier gas and triethyl borate as the active impurity material, it has been found that the temperature can be lowered to approximately 250° C. during the deposition of the active impurity material to the semiconductor body. Deposition occurs below this temperature but at a rate which is so slow that it becomes impractical for commercial utilization. For the same reasons it has been found that when utilizing tetraethyl silicate as the source of oxide of semiconductor material along with argon as the carrier gas that the lowest practical temperature is 500° C.

The upper limit of the temperature to which the semiconductor bodies can be subjected during the method in accordance with the present invention is that temperature at which the radical group begins to break down. The breakdown of the radical group causes the formation within the furnace of soot and acetylene and other undesired products of combustion that contaminate the surface of the semiconductor body.

Figure 5:
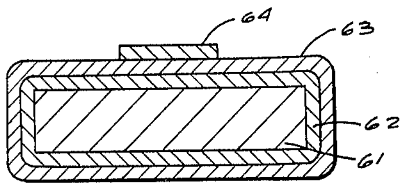
FIGS. 5 through 7 illustrate a semiconductor body at various stages of manufacture utilizing the method of the present invention but having started with a different configuration of semiconductor body.
Figure 6:
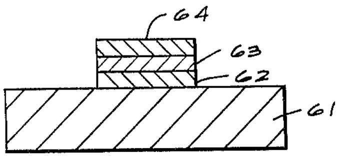
Figure 7:
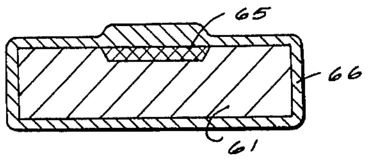

The method of the present invention may also be utilized upon semiconductor bodies having a different preparation step as is illustrated in FIGS. 5 through 7. For example, a semiconductor body can be freshly etched with no oxide layer formed thereon. Under these circumstances the semiconductor body is inserted into the furnace 11 after the temperature therein has been stabilized. At this point the active impurity material is caused to enter the furnace thereby depositing a layer 62 of active impurity material upon the surface of the semiconductor body 61. Thereafter the valve 31 is closed, the valve 35 opened, while at the same time closing valve 23, thus causing the tetraethyl silicate and argon to flow into the furnace for the predetermined period of time, for example one hour, as above set forth. During this period of time an additional layer of silicon and oxygen atoms 63 is deposited upon the surface of the semiconductor body containing the layer 62 of boron material thereon. Thus the semiconductor body 61 is completely surrounded by a layer of boron material which subsequently is also completely surrounded by the layer of an oxide of silicon 63. A mask 64 is then applied to the surface of the oxide of semiconductor material 63 covering that area of the semiconductor body into which it is desired to diffuse the active impurity material. Thereafter the semiconductor body is subjected to an etching solution, for example, ammonium fluoride, such that all of the oxide of semiconductor and active impurity material is removed from the semiconductor body with the exception of that material immediately underneath the mask 64. Such a structure is as illustrated in FIG. 6. Thereafter the semiconductor body is placed within the normal diffusion furnace for the period of time required to cause the active impurity material to diffuse into the surface of the semiconductor body and during the same period of time a thermally formed silicon dioxide layer can be formed about the entire surface of the semiconductor body if such is desired. Such a structure is as illustrated in FIG. 7, showing the semiconductor body 61 having a converted P-type region 65 therein and a layer 66 of silicon dioxide formed about the entire surface of the semiconductor body.

After a semiconductor body has been treated in accordance with the method of the present invention resulting in bodies as is illustrated in FIG. 4, FIG. 7, or otherwise, subsequent well known steps may be carried out upon the semiconductor bodies to form transistors, diodes, or other desired semiconductor products. The end device may then be encapsulated in accordance with well known prior art techniques and a finished semiconductor product has thus been provided.

There has thus been disclosed a method of controlling diffusion of active impurity materials into semiconductor bodies which is simple, effective, and results in improved semiconductor products.

What is claimed is:

1. The method of controlling the source of active impurity material available for diffusion into a semiconductor body comprising: depositing from a decomposable organic compound source thereof a layer of active impurity material upon at least a portion of the surface of said semiconductor body heated to a first temperature at which the bond of said compound decompose but below that temperature at which significant diffusion occurs; depositing from a decomposable source thereof a layer of oxide of semiconductor material upon at least said layer of active impurity material, said body being heated to a higher second temperature at which the bond of said oxide compound decomposes; and heating said semiconductor body to a third temperature sufficient for diffusing said active impurity material into said semiconductor body.

2. The method as defined in claim 1 wherein said source of oxide of semiconductor material includes atoms of the same type semiconductor material as that of said body.

3. The method as defined in claim 1 wherein said source of oxide of semiconductor material follows the formulation S—O—R where S is a semiconductor material, O is oxygen, and R is an organic radical, such that the bond between O and R is broken when subjected to a predetermined temperature.

4. The method as defined in claim 3 wherein S is silicon and R is an organic radical selected from the group consisting of ethyls, methyls, butyls, and phenols.

5. The method of controlling the source of active impurity material available for diffusion into a semiconductor body comprising: heating a semiconductor body to a first predetermined temperature; contacting the surface of said body with a vapor comprising a decomposable organic compound of an active impurity material; heating said semiconductor body to a second predetermined temperature; contacting the surface of said body with a vapor comprising a decomposable compound S—O—R, where S is a semiconductor material, O is oxygen, and R is an organic radical, said first temperature being determined by that temperature at which said compound decomposes and deposits said active impurity upon the surface of said body but below that temperature at which diffusion occurs, said second temperature being determined by that temperature at which the bond between O—R breaks down thereby depositing semiconductor and oxygen atoms to form an oxide of semiconductor layer upon said previously deposited active impurity but below that temperature at which the organic radical breaks down; and heating said semiconductor body to a third temperature sufficient for diffusing said active impurity material into said semiconductor body.

6. The method as defined in claim 5 in which said decomposable compound of active impurity material is an ester of an acid of an active impurity.

7. The method as defined in claim 5 wherein said decomposable active impurity compound is dispersed within a carrier gas.

8. The method as defined in claim 5 wherein said decomposable S—O—R compound is dispersed within a carrier gas.

9. The method of controlling the source of active impurity material available for diffusion into a semiconductor body comprising: heating a semiconductor body having a first conductivity type to a first predetermined temperature; contacting the surface of said body with a vapor comprising a decomposable organic compound of an active impurity material of the opposite conductivity type; heating said semiconductor body to a second predetermined temperature; contacting the surface of said body with a vapor comprising a decomposable compound S—O—R, where S is a semiconductor material, O is oxygen, and R is an organic radical, said first temperature being determined by that temperature at which said compound decomposes and deposits said active impurity upon the surface of said body but below that temperature at which diffusion occurs, said second temperature being determined by that temperature at which the bond between O—R breaks down thereby depositing semiconductor and oxygen atoms to form an oxide of semiconductor layer upon said previously deposited active impurity but below that temperature at which the organic radical breaks down; selectively removing said deposited active impurity material and oxide of semiconductor layer from all portions of said body except where it is desired to change the conductivity type thereof; and heating said semiconductor body to a third temperature sufficient for diffusing said active impurity material into said semiconductor body.

10. The method as defined in claim 9 in which said semiconductor body is silicon, said compound of active impurity material is triethyl borate, and said decomposable S—O—R compound is tetraethyl silicate.

11. The method as defined in claim 10 in which said first predetermined temperature is approximately 350° C. and said second predetermined temperature is approximately 600° C.

12. The method of controlling the source of active impurity material available for diffusion into a semiconductor body comprising: heating a silicon semiconductor body having one conductivity type to a temperature between approximately 250° C. and 800° C.; contacting said heated body with an ester of an acid of an active impurity material of the opposite conductivity type dispersed in a carrier gas for a time sufficient to deposit a layer of active impurity material upon the surface of said body; heating said silicon body to a temperature between approximately 500° C. and 800° C.; contacting said heated body with a compound having the formula S—O—R where S is silicon, O is oxygen, and R is an organic radical, dispersed in a carrier gas for a time sufficient to coat said layer of active impurity material with a layer of oxide of silicon; and heating said semiconductor body to a temperature sufficient for diffusing said active impurity material into said semiconductor body.

13. The method as defined in claim 12 wherein said carrier gas is passed through a container of said ester of an acid of an active impurity material thereby to disperse said active impurity material in a carrier gas and said carrier gas is passed through a container of said S—O—R compound thereby to disperse said S—O—R compound within said carrier gas.

14. The method defined in claim 13 wherein said silicon body is N conductivity type, said ester of an acid of an active impurity material is triethyl borate, said S—O—R compound is tetraethyl silicate, and said carrier gas is argon.

15. The method defined in claim 14 wherein said argon flows through said container of triethyl borate for a period of approximately two minutes and through said container of tetraethyl silicate for a period of approximately one hour.

References Cited by the Examiner

UNITED STATES PATENTS

| | | | |
|---|---|---|---|
| 2,802,760 | 8/1957 | Derick et al. | 148—1.5 |
| 2,879,190 | 3/1959 | Logan et al. | 148—1.5 |
| 3,022,568 | 2/1962 | Nelson | 148—1.5 |
| 3,055,776 | 9/1962 | Stevenson et al. | 148—1.5 X |
| 3,066,052 | 11/1962 | Howard | 148—189 |
| 3,084,079 | 4/1963 | Harrington | 148—187 |
| 3,114,663 | 12/1963 | Klerer | 148—179 |

BENJAMIN HENKIN, *Examiner.*

DAVID L. RECK, *Primary Examiner.*